United States Patent [19]
Burns et al.

[11] Patent Number: 5,440,150
[45] Date of Patent: Aug. 8, 1995

[54] NON-CRYSTALLINE SILICON ACTIVE DEVICE FOR LARGE-SCALE DIGITAL AND ANALOG NETWORKS

[75] Inventors: Stanley G. Burns, Ames; Robert J. Weber, Boone, both of Iowa

[73] Assignee: Iowa State University Research Foundation, Inc., Ames, Iowa

[21] Appl. No.: 305,403

[22] Filed: Sep. 13, 1994

Related U.S. Application Data

[63] Continuation of Ser. No. 759,182, Sep. 10, 1991, abandoned, which is a continuation of Ser. No. 464,894, Jan. 16, 1990, abandoned.

[51] Int. Cl.⁶ .................... H01L 29/786; H01L 29/04
[52] U.S. Cl. .......................... 257/57; 257/67; 257/365; 257/74
[58] Field of Search .............. 357/2, 4, 23.14, 30, 357/59, 23.7; 364/513, 200; 307/201; 257/57, 67, 365, 74; 395/2.11, 21

[56] References Cited

U.S. PATENT DOCUMENTS

| | | | |
|---|---|---|---|
| 3,355,598 | 11/1967 | Tuska | 357/23.14 |
| 4,065,781 | 12/1977 | Gutknecht | 357/23.7 |
| 4,272,880 | 6/1981 | Pashley | 357/59 |
| 4,598,305 | 7/1986 | Chiang et al. | 357/30 |
| 4,672,577 | 6/1987 | Hirose | 357/30 |
| 4,679,062 | 7/1987 | Okamoto | 357/2 |
| 4,760,437 | 7/1988 | Denker et al. | 357/2 |
| 4,807,168 | 2/1989 | Moonpen et al. | 307/201 |
| 4,902,637 | 2/1990 | Kondou | 357/23.7 |
| 4,943,931 | 7/1990 | Allen | 364/200 |

*Primary Examiner*—Jerome Jackson
*Attorney, Agent, or Firm*—Leydig, Voit & Mayer, Ltd.

[57] ABSTRACT

A non-crystalline silicon—preferably a-Si:H—active device for use in a large-scale hardware implementation of an artificial neural network system having an analog and digital mixed morphology. A plurality of a-Si:H thin-film transistors (TFTs) implement addition, multiplication and weighting functionality and are arranged in a highly-connected morphology with other active and passive semiconductor elements. Electrical signals are selectively applied to metal plates and light-emitting devices in order to locally or globally alter the threshold characteristics of the TFTs.

39 Claims, 4 Drawing Sheets

NON-CRYSTALLINE SILICON ACTIVE DEVICE FOR LARGE-SCALE DIGITAL AND ANALOG NETWORKS

This is a continuation of application Ser. No. 759,182, filed on Sep. 10, 1991, abandoned, which is a continuation of Ser. No. 464,894, filed on Jan. 16, 1990 (now abandoned).

FIELD OF THE INVENTION

The present invention relates to semiconductor devices, and more particularly to a semiconductor device for use in a hardware implementation of an artificial neural network system.

BACKGROUND OF THE INVENTION

The human brain is significantly faster than even modern computers when it comes to performing intelligent information processing, such as image recognition, language comprehension or combinatorial optimization. Primarily, this is because of fundamental differences in the information processing architectures of computers and human brains. Most digital computers use sequential processing, while the human brain utilizes massively parallel computation. More specifically, the human brain comprises a dense network of numerous (approximately $10^{10}$) functionally simple logic elements—neurons—which are interconnected in varying strengths by an even larger number (approximately $10^{14}$) of still simpler interconnecting passive elements—synapses. This type of network configuration is now commonly referred to as a neural network architecture. Hormonal activity in the brain varies the effective weighting of the synaptic interconnections.

In recent years, considerable effort has been made to develop hardware—as opposed to software (or computer-controlled)—implementations of artificial neural network systems. These hardware systems attempt to simulate the massive parallelism of the human brain so that intelligent, associative information processing can be performed.

Hardware realizations of neural networks, to date, have been designed generally as illustrated by the $N \times N$ matrix of FIG. 1. The neurons are typically represented by simple thresholding amplifiers ($A_1, A_2, A_3 \ldots A_N$) and the synapses take the form of a matrix of passive interconnecting elements, such as high-value switched resistors ($R_{12}, R_{22}, R_{31}$, etc.). As shown in FIG. 1, the output voltage of each amplifier is fed back by way of resistive elements to its own input and to the input of each of the other amplifiers. A network having N amplifiers will, therefore, have as many as $N^2$ resistive elements in the interconnecting matrix. Consequently, a large-scale hardware realization occupies an extensive semiconductor area, with as much as eighty to ninety percent of that area taken up by the massive interconnecting matrix.

Due to its flexibility, which accommodates fabrication in large sheets, non-crystalline silicon—such as hydrogenated amorphous silicon (a-Si:H)—has been used as the semiconductor platform for some of these hardware realizations, even though it does not conduct as well as crystalline silicon or gallium arsenide.

The passive nature of the synaptic (resistive) elements has precluded variable weighting in these prior neural implementations. In fact, the prior hardware implementations were typically fabricated by burning out resistive elements at predetermined locations in the interconnecting matrix. Consequently, no reversible (or variable) weighting of the synaptic interconnections has been possible and, therefore, the prior artificial implementations are only very limited simulations of natural neural network systems.

SUMMARY OF THE INVENTION

In view of the foregoing, it is a general aim of the present invention to provide an active semiconductor device which will enable hardware implementations of artificial neural network systems to simulate hormonal (i.e., variable weighting) activity and, thereby, mimic natural neural networks more closely than artificial implementations in the past.

In that regard, it is an object of the present invention to provide a non-crystalline silicon device having a plurality of active and passive semiconductor devices arranged in a highly-connected morphology.

Another object of the present invention is to provide such a non-crystalline silicon device with biasing means for selectively altering the threshold characteristics of the semiconductor devices.

A still further object of the present invention is to utilize a-Si:H thin-film transistors in such a device to realize at least some of the semiconductor devices.

Other objects and advantages will become apparent from the following detailed description when taken in conjunction with the drawings, in which:

While the invention will be described in connection with certain preferred embodiments, there is no intent to limit it to those embodiments. On the contrary, the intent is to cover all alternatives, modifications and equivalents included within the spirit and scope of the invention as defined by the appended claims.

DETAILED DESCRIPTION OF THE PREFERRED EMBODIMENTS

Figure 2:
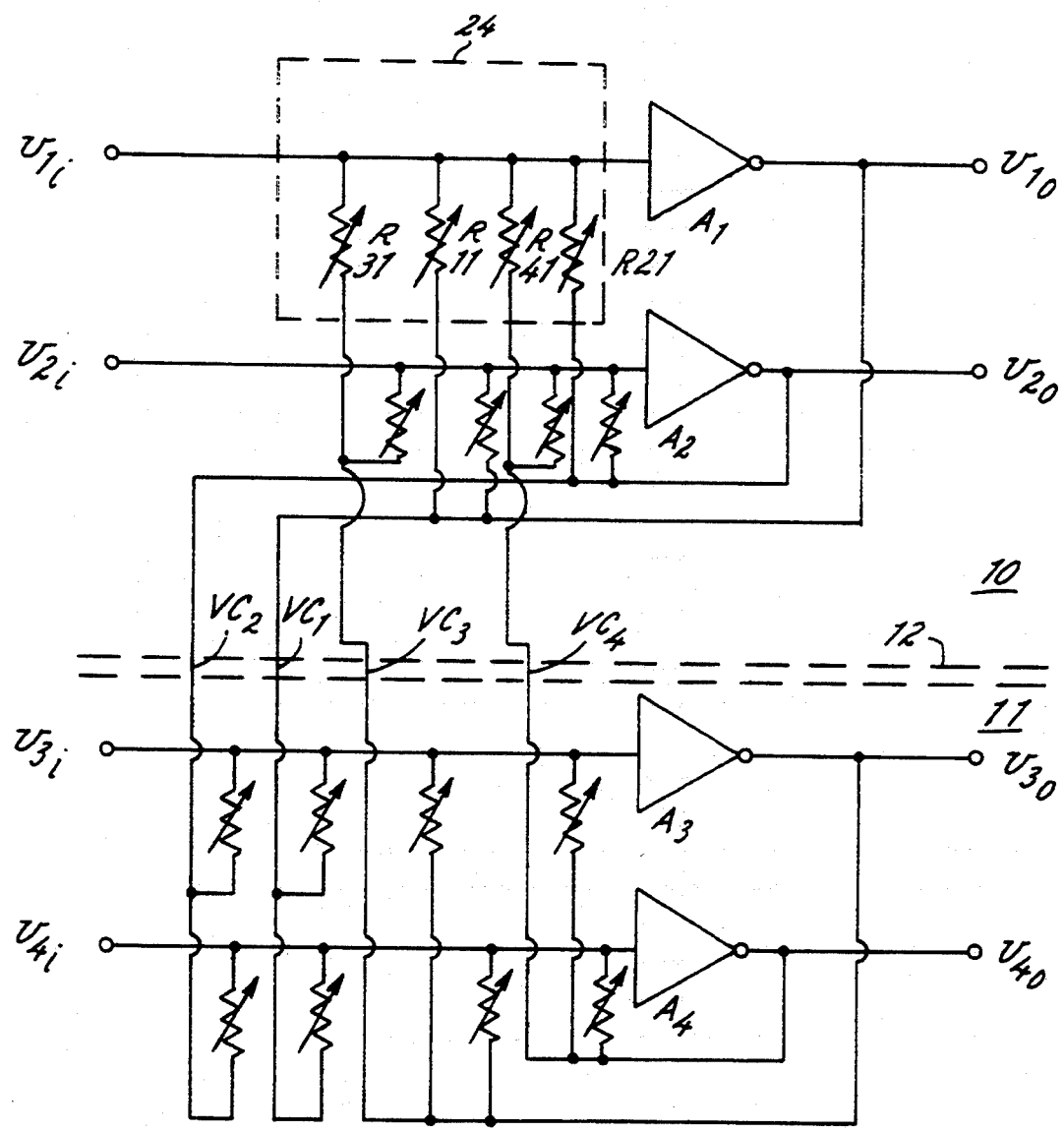
FIG. 2 is a circuit diagram of a hardware realization of a neural network exemplifying the present invention.

Turning now to the drawings and referring first to FIG. 2, there is shown a basic circuit diagram of the inventive hardware realization of an artificial neural network which accomplishes the electronic analog of synapse and neural functionality. This hardware implementation incorporates active elements that provide programmable variable-weighted inputs and variable-threshold comparison. More specifically, FIG. 2 shows a double-layer $2 \times 2$ integrated circuit (IC) device having a total of four variable-threshold comparators and sixteen variable-weighted resistive elements associated with and interconnecting the comparators. It will, of course, be appreciated that a substantially larger $N \times N \times N$ configuration of this IC device (for example, a device having one-hundred thousand or more active elements, which can be easily accommodated by a multiple-layer non-crystalline silicon structure) would more closely simulate a natural neural network system, but this scaled-down diagram will suffice for purposes of explaining the desired neural network architecture of the invention.

Generally, the depicted embodiment of the inventive IC device has two layers of non-crystalline silicon 10, 11 separated by a flexible layer of dielectric material 12, such as polyimide. A pair of amplifiers (comparators) are formed in each semiconductor layer along with associated resistive elements and a metallized interconnecting matrix. For example, a first amplifier $A_1$, four variable resistors ($R_{11}$, $R_{21}$, $R_{31}$, $R_{41}$) connected to its input, and appropriate input, output and interconnecting lines are formed by well-known fabrication techniques in the first semiconductor layer 10. The variable resistors are coupled to the outputs of each of the amplifiers and provide variable-weighted inputs to the amplifier $A_1$. Outputs of the amplifiers $A_3$, $A_4$ in the second semiconductor layer 11 are coupled to the resistors $R_{31}$ and $R_{41}$ by means of via conductors $VC_3$, $VC_4$ that extend through the polyimide layer 12. The other amplifiers have similar associated circuitry with similarly complex interconnecting networks and, as a result, the device overall has a highly-connected morphology.

In accordance with an important aspect of this invention, non-crystalline silicon thin-film transistors (TFTs) are used to realize the variable-threshold comparators and variable-weighted resistors of the device. As mentioned previously, non-crystalline silicon (e.g., amorphous silicon, hydrogenated amorphous silicon or polysilicon) is less conductive than crystalline silicon or gallium arsenide (GaAs), but is relatively inexpensive and can be easily produced on a large, flexible substrate to form flexible semiconductor devices. For example, fabrication of flexible semiconductor devices on 12-inch wide strip (or significantly larger) substrate is possible. Moreover, non-crystalline silicon can be processed at relatively low temperatures and, consequently, accommodates fabrication of devices having numerous (upwards of 4 or 5) metallization layers, which are needed to form the highly-connected structure. If each TFT is allowed, conservatively, a substrate area of $6 \times 10^3 \mu m^2$, more than 10 million devices can be fabricated on each layer of a large (e.g., 30 cm $\times$ 30 cm square) structure. In other words, non-crystalline silicon enables the production of large area, multi-layer networks having a highly connected morphology. Because of this high connectivity, the relatively low electron mobility $\mu_n$ (e.g., on the order of only 1 cm$^2$/v-s for a-Si:H TFTs) of non-crystalline silicon TFTs is at least partially compensated. Therefore, non-crystalline silicon is ideal for large-scale hardware implementations of artificial neural network systems according to the invention.

Figure 1:
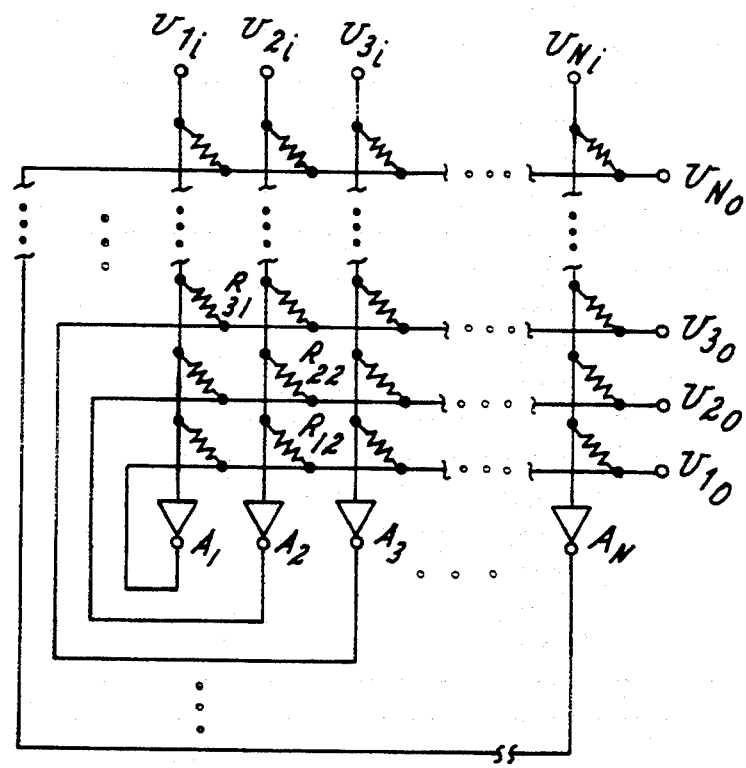
FIG. 1 is a circuit diagram of a prior hardware implementation of a neural network in which an $N \times N$ resistive matrix interconnects N amplifiers.
Figure 3:
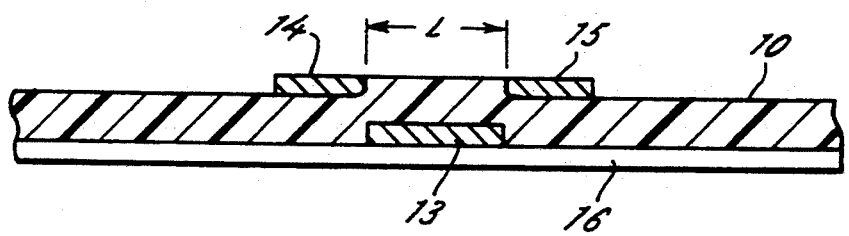
FIG. 3 is a cross-sectional view of a non-crystalline TFT structure according to the present invention.

The basic morphology of an a-Si:H TFT is shown in FIG. 3, the structure being essentially that of an n-channel Metal-Oxide Semiconductor Field-Effect Transistor (MOSFET). The gate 13, source 14 and drain 15 electrodes and a doped a-Si:H layer 10 are rf sputter deposited on a flexible polyimide substrate 16 in a manner similar to that being used for large-area photovoltaic arrays. Ideally, the a-Si:H layer 10 should have a thickness of only about 1–2 microns and the length L of the gate electrode 13 should be in the range of 1–10 microns (preferably about 5 microns). The width W (see FIG. 5a) of the gate electrode 13 is essentially unlimited—since the a-Si:H can be fabricated in large flexible sheets—but ideally should be in the range of 10–100 times greater than its length L.

The drain current $I_D$ that can be expected for this a-Si:H TFT is defined by the following ohmic region equation, $$I_D \approx \frac{\mu_n C_{ox} W}{L} (V_{GS} - V_T) V_{DS},$$

where $\mu_n$ is the electron mobility in a-Si:H, $V_{GS}$, $V_T$ and $V_{DS}$ are the gate-source, threshold and drain-source voltages, respectively, and $C_{ox}$ is the capacitance per unit area. The capacitance per unit area value is defined by the equation $$C_{ox} = \frac{\epsilon_0 \epsilon_r}{t}$$

where $\epsilon_0$ is the permitivity of free space ($8.854 \times 10^{-12}$ f/m), $\epsilon_r$ is the relative dielectric constant (11.9) and t is the thickness of the SiO$_2$ oxide. In contrast, the drain current at saturation $I_{DS}$ may be calculated using the following equation, $$I_{DS} \approx \frac{\mu_n C_{ox} W}{2L} (V_{GS} - V_T)^2$$

Typically, for an a-Si:H TFT having a gate length L of 10 microns, an ohmic region drain current $I_D$ of approximately $2 \times 10^{-7}$ amperes can be expected per micron of gate width W, whereas a saturation region drain current $I_{DS}$ on the order of $10^{-6}$ amperes can be expected per micron of gate width W.

Figure 4:
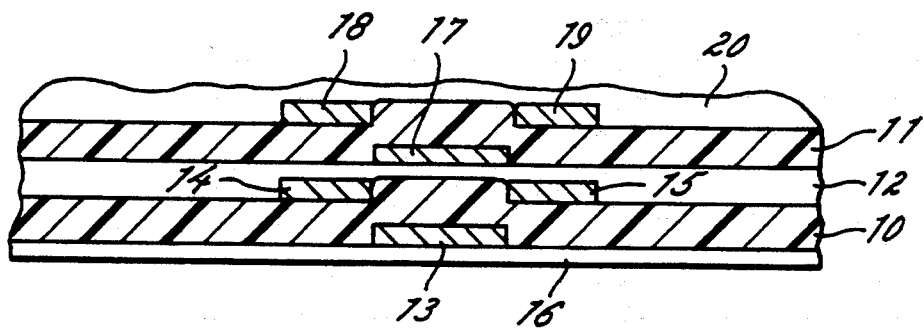
FIG. 4 is a view similar to FIG. 3 showing a multi-layer TFT structure.

As discussed above, as much as eighty or ninety percent of the semiconductor chip area is needed in a hardware implementation of a neural network for the large number of interconnections in the matrix. Consequently, single-level and even double-level metallization interconnections are inadequate for fabrication of large-scale neural network arrays. Because of its flexibility and relatively low processing temperature, a-Si:H is ideal for fabrication of multi-layer devices and, therefore, works very nicely for hardware implementations of neural networks. A multi-layer a-Si:H TFT structure is shown in FIG. 4. Generally, this structure has a first layer identical to that shown in FIG. 3 (including a polyimide substrate 16, gate 13, source 14 and drain 15 electrodes and a thin a-Si:H layer 10), with another dielectric (polyimide) layer 12 formed thereon. A second TFT is then fabricated on the interposed polyimide layer 12, having gate 17, source 18 and drain 19 electrodes and a second thin a-Si:H layer 11. The TFTs are, of course, connected to one another and to other active and passive elements in the network by way of both intralayer and interlayer (via) metallization patterns (shown schematically in FIG. 2). Additional dielectric 20 and a-Si:H/metallization layers may be fabricated in like fashion on this structure as are needed to implement a hardware neural network system. This three-dimensional structure significantly enhances connectivity permutations and, thus, permits the realization of very large arrays. This is currently the most significant advantage of a-Si:H TFTs over CMOS realizations.

In order to perform programmable weighting and comparator threshold functions, some unique TFT topologies are required. Specifically, topologies are necessary which enable the electronic functions of addition and multiplication.

Figure 5A:
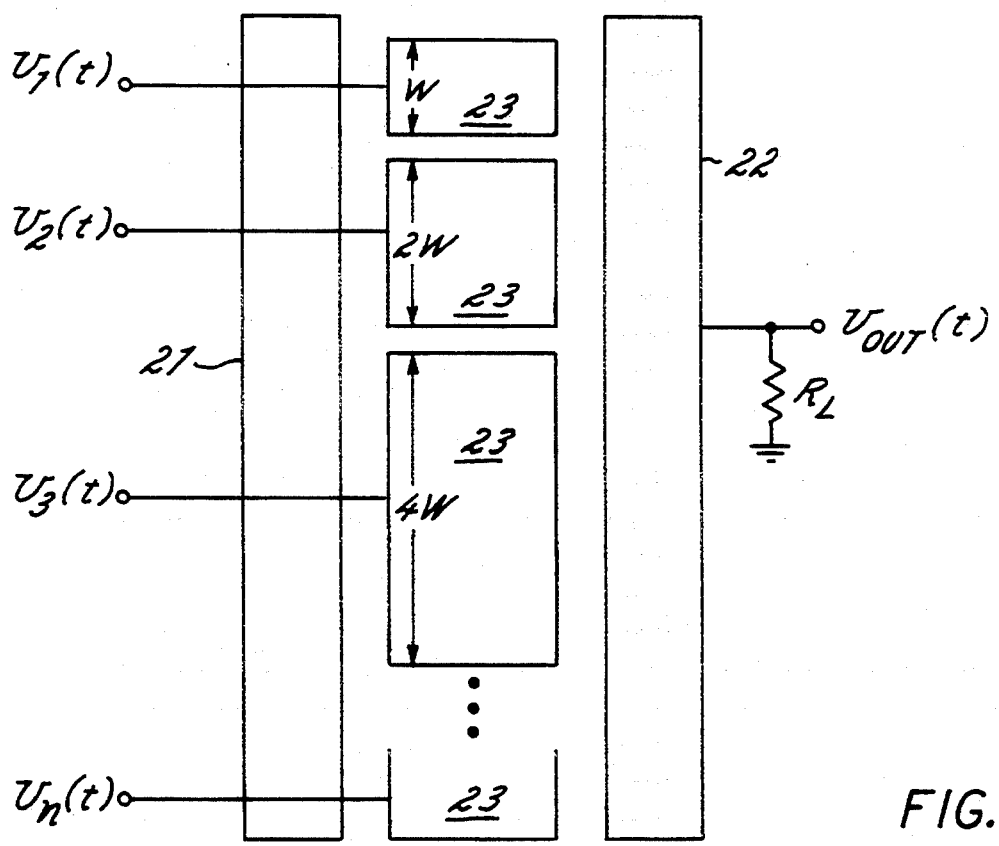
FIGS. 5a and 5b, respectively, are schematic and equivalent circuit diagrams of a multi-input binary-scaled digital summer according to the present invention.
Figure 5B:
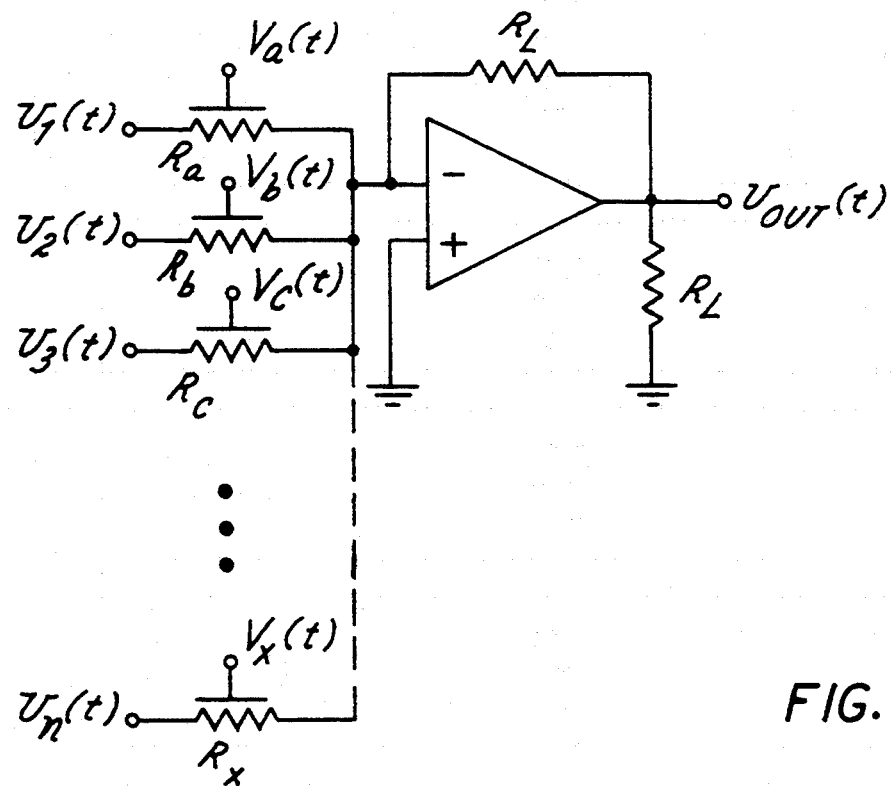

According to an important aspect of this invention, a summing TFT is used to realize the electronic function of addition. A schematic diagram of an implementation of a multi-input binary-scaled digital summer is shown in FIG. 5a (with an equivalent circuit shown in FIG. 5b). The summing TFT comprises a source electrode 21, a drain electrode 22 and a parallel array of gate electrodes 23 having different—preferably, binary scaled—widths. Each of the gates 23 receives an input voltage, and an output terminal and resistor $R_L$ are connected to the drain 22. This type of summing TFT may, of course, be effectively used in a hardware implementation of a neural network to realize a group 24 of resistive elements—for example, $R_{11}$, $R_{21}$, $R_{31}$, $R_{41}$ in FIG. 2—which are coupled to a single comparator.

Each gate-source-drain combination in the device of FIG. 5a represents a distinct resistive element ($R_a$, $R_b$, $R_c$ ... $R_x$) having an impedance—i.e., fixed weighting—which is dependent on its gate width (W, 2W, etc.). Variable weighting of the resistive elements is accomplished by operating the TFT below threshold. This is done by selectively coupling biasing voltages ($V_a$, $V_b$, $V_c$ ... $V_x$) to the different gate elements. The biasing procedure, which alters the threshold characteristics of the device, is discussed in greater detail below.

Operating below threshold, the ohmic value of the resistive element $R_a$, for example, is defined by the equation $$R_a \approx \frac{\Delta V_{DS}}{\Delta I_D} = \left[ \frac{\mu_n C_{ox} W}{L} (V_a - V_T) \right]^{-1},$$

and the output voltage $V_{out}$ of the summing TFT is defined by the equation $$V_{out} = R_L \left[ \frac{V_1}{R_a} + \frac{V_2}{R_b} + \frac{V_3}{R_c} + \ldots + \frac{V_n}{R_x} \right]$$

Thus, it will be appreciated that the weight of each distinct resistive element depends on both the width of the respective gate and the variable biasing which is selectively applied to that gate, and these weights affect the ultimate output of the summer.

Figure 6:
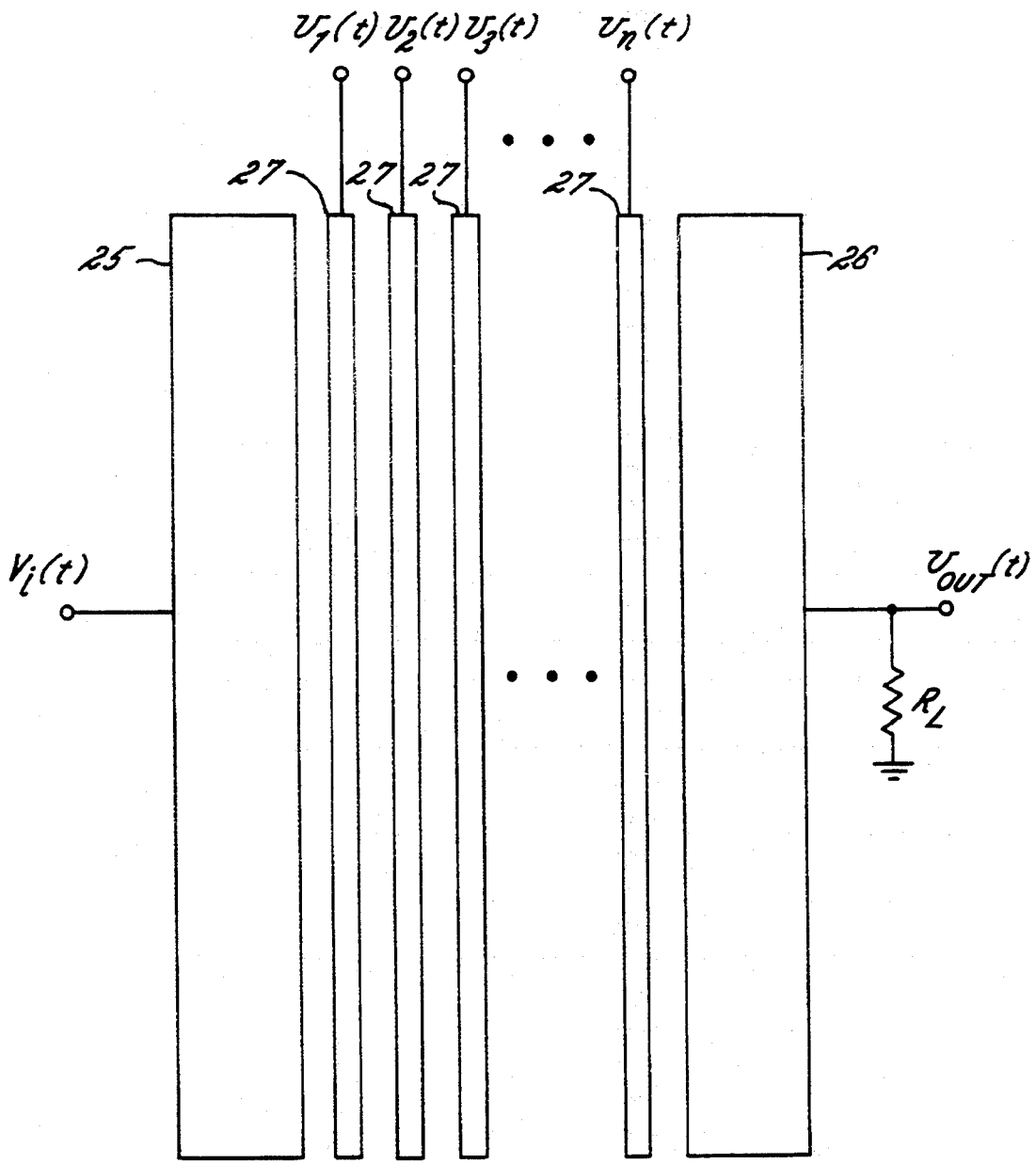
FIG. 6 is a schematic diagram of a multi-input analog multiplier according to the present invention.

In accordance with another important aspect of this invention, a second unique a-Si:H TFT structure is used to realize the electronic function of multiplication in the hardware neural network according to the present invention. Specifically, this second unique TFT (shown schematically in FIG. 6) is a multi-input analog multiplier and is patterned after well-known dual-gate MOSFET topology. It includes a source electrode 25, a drain electrode 26 and a series array of gate electrodes 27 interposed between the source and the drain. The drain current $I_D$ for this device is defined by the following equation $$I_D \approx \frac{\mu_n C_{ox} W}{2L} [(V_1 - V_T)^2 (V_2 - V_T)^2 \ldots (V_n - V_T)^2]$$

where $V_1, V_2 \ldots V_n = V_{GS}$ for each of the gates in the multi-gate structure, and the saturation characteristics for the multiplying TFT are given by $$V_{out} = V_1 V_2 V_3 \ldots V_n.$$

As discussed above for the summing TFT, the threshold characteristics of this multiplying TFT can also be controlled by selectively changing the regional substrate biases.

Figure 7:
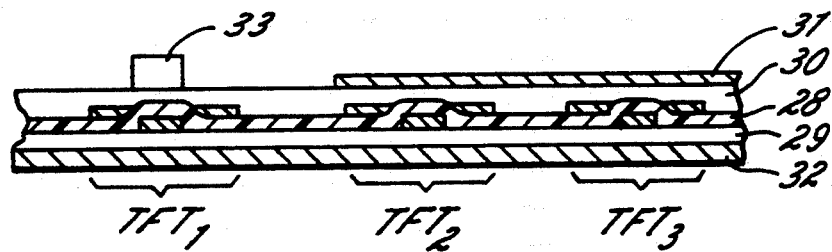
FIG. 7 is a view similar to FIG. 3 showing metallized plates and light-emitting devices which are used according to the present invention to bias semiconductor devices in the network.

Biasing of the gate electrodes in order to alter the threshold characteristics of the TFTs may be implemented in any of a number of ways. Preferably, metallization patterns of predetermined configuration are formed in the device. FIG. 7 shows three TFTs formed on an a-Si:H layer 28 which is sandwiched between a pair of dielectric (polyimide) layers 29, 30. A metallized bias plate 31 is formed on the top surface of the dielectric layer 30 and is superimposed over two of the transistors ($TFT_2$ and $TFT_3$). Electrical signals are selectively applied to the plate 31 and, accordingly, the resulting potential alters the threshold characteristics of $TFT_2$ and $TFT_3$ in a well-known fashion. A second biasing plate 32 may be used, if desired, to selectively apply a different biasing potential to all three of the TFTs.

Light-emitting devices 33 may also be used to bias the semiconductor devices. In response to selectively applied electrical signals, a light-emitting device 33 produces emissions of photo energy. This energy creates hole-electron pairs in the photosensitive a-Si:H (or other non-crystalline silicon) layer and, thereby, alters the threshold characteristics of any device ($TFT_1$ in FIG. 7) which is optically coupled to the light-emitting device. This effect is well-known in the art.

Of course, combinations of metallized biasing plates and light-emitting devices are utilized to form a complex bias network, with the design of the bias network and control of the application of electrical signals to the different elements in the bias network permitting global and/or local threshold modification of devices within the hardware neural network. Accordingly, such an artificial neural network may closely imitate the hormonal activity of a natural neural network.

In view of the foregoing, it will now be appreciated that what has been provided is an active semiconductor device that enables simulation of hormonal activity—by variable weighting—in a hardware implementation of an artificial neural network system. Non-crystalline silicon (preferably a-Si:H) TFTs are used to implement addition, multiplication and weighting functionality and are arranged in a highly-connected morphology with other active and passive semiconductor elements. Biasing means are used for selectively altering the threshold characteristics (and, thus the weighting) of the TFTs.

What is claimed is:

1. A non-crystalline silicon active device for processing electrical signals, said device comprising:
   a flexible substrate of large dimension;
   a plurality of non-crystalline silicon layers formed on said substrate, said silicon layers being electrically isolated from one another by dielectric layers interposed therebetween and each silicon layer having formed therein a plurality of semiconductor devices, at least one of said semiconductor devices comprising a multi-input thin-film summing transistor having a threshold voltage characteristic and a parallel array of weighted gate electrodes, said gate electrodes having binary-scaled widths for providing the corresponding weights thereto; and multiple interlayer and intralayer interconnections electrically connecting outputs of a preselected plurality of said semiconductor devices to variably weighted inputs of another preselected plurality of said semiconductor devices, thus providing a highly-connected morphology including neural network architectures.

2. The device of claim 1, wherein said non-crystalline silicon is amorphous silicon.

3. The device of claim 2, wherein said amorphous silicon is hydrogenated.

4. The device of claim 1, wherein said non-crystalline silicon is polysilicon.

5. The device of claim 1, wherein at least some of said semiconductor devices are digital.

6. The device of claim 1, wherein at least some of said semiconductor devices are analog.

7. The device of claim 1, wherein some of said semiconductor devices are digital and the others of said semiconductor devices are analog, whereby said device has an analog and digital mixed morphology.

8. The device of claim 1, wherein at least one of said semiconductor devices comprises a multi-input thin-film multiplying transistor having a threshold voltage characteristic.

9. The device of claim 8, wherein said multiplying transistor has a series array of gate electrodes.

10. The device of claim 1, wherein at least some of said semiconductor devices have threshold voltage characteristics, said device further comprising biasing means for selectively altering the threshold voltage characteristics of groups of said semiconductor devices.

11. The device of claim 10, wherein said biasing means comprises:
at least one conductive element spaced from and electrically coupled to one or more of said semiconductor devices; and
interconnections for providing electrical signals to said conductive element, whereby a potential results on said conductive element which alters the threshold voltage characteristics of said coupled semiconductor devices.

12. The device of claim 11, wherein said conductive element comprises a metallization layer, said metallization layer and said coupled semiconductor devices having a dielectric layer interposed therebetween.

13. The device of claim 10, wherein said biasing means comprises:
at least one light-emitting device coupled to one or more of said semiconductor devices; and
interconnections for providing electrical signals to said light-emitting device to produce emissions of photo energy therefrom, whereby said photo energy alters the threshold voltage characteristics of said coupled semiconductor devices.

14. A non-crystalline silicon active device for processing electrical signals, said device comprising:
an integrated circuit having a flexible substrate of large dimension with a non-crystalline silicon layer formed on one side of said substrate, said integrated circuit comprising a plurality of variably weighted multi-input thin-film summing transistors which have threshold voltage characteristics, at least one of said summing transistors having a parallel array of weighted gate electrodes, said gate electrodes having successively binary-scaled widths for providing the corresponding weights thereto, a plurality of variably weighted multi-input thin-film multiplying transistors which have threshold voltage characteristics, and means electrically interconnecting outputs of preselected ones of said summing and multiplying transistors to the variably weighted inputs of preselected ones of said summing and multiplying transistors, thus providing a highly-connected morphology including neural network architectures; and biasing means for selectively altering the threshold voltage characteristics of groups of said summing and multiplying transistors.

15. The device of claim 14, wherein said non-crystalline silicon is amorphous silicon.

16. The device of claim 15, wherein said amorphous silicon is hydrogenated.

17. The device of claim 14, wherein said non-crystalline silicon is polysilicon.

18. The device of claim 14, wherein some of said semiconductor devices are digital and others of said semiconductor devices are analog, whereby said device has a digital and analog mixed morphology.

19. The device of claim 14, wherein said integrated circuit is multi-layered, comprising a plurality of electrically-isolated non-crystalline silicon layers formed on said substrate with each layer having a plurality of transistors formed thereon, said circuit layers being interconnected by a plurality of via connectors.

20. The device of claim 14, wherein said biasing means comprises:
at least one conductive element spaced from and electrically coupled to one or more of said transistors; and
interconnections for providing electrical signals from said circuit to said conductive element, whereby a potential results on said conductive element which alters the threshold voltage characteristics of said coupled transistors.

21. The device of claim 20, wherein said conductive element comprises a metal plate, said metal plate and said coupled transistors having a dielectric layer interposed therebetween.

22. The device of claim 14, wherein said biasing means comprises:
a plurality of conductive elements, each being spaced from and electrically coupled to one or more of said transistors; and
interconnections for providing electrical signals from said circuit to each of said conductive elements, whereby a respective potential results on each of said conductive elements and alters the threshold voltage characteristics of said coupled transistors.

23. The device of claim 14, wherein said biasing means comprises:
at least one light-emitting device coupled to one or more of said transistor gate electrodes; and
interconnections for providing electrical signals from said circuit to said light-emitting device to produce emissions of photo energy therefrom, whereby said photo energy alters the threshold voltage characteristics of said coupled transistors.

24. The device of claim 14, wherein at least one multiplying transistor with a threshold voltage characteristic has a series array of gate electrodes.

25. A non-crystalline silicon active device for processing electrical signals, said device comprising:
a flexible substrate of large dimension;
a plurality of non-crystalline silicon layers formed on said substrate, said silicon layers being electrically isolated from one another by dielectric layers interposed therebetween and each silicon layer having formed therein a plurality of semiconductor devices, at least one of said semiconductor devices comprising a multi-input thin-film multiplying transistor having a threshold voltage characteristic and a series array of gate electrodes; and
multiple interlayer and intralayer interconnections electrically connecting outputs of a preselected plurality of said semiconductor devices to variably weighted inputs of another preselected plurality of said semiconductor devices, thus providing a highly-connected morphology including neural network architectures.

26. The device of claim 25, wherein at least one of said semiconductor devices comprises a multi-input thin-film summing transistor having a threshold voltage characteristic.

27. The device of claim 26, wherein said summing transistor has a parallel array of weighted gate electrodes, said gate electrodes having binary-scaled widths for providing the corresponding weights thereto.

28. The device of claim 25, wherein said non-crystalline silicon is hydrogenated amorphous silicon.

29. The device of claim 25, wherein at least some of said semiconductor devices have threshold voltage characteristics, said device further comprising biasing means for selectively altering the threshold voltage characteristics of groups of said semiconductor devices.

30. The device of claim 29, wherein said biasing means comprises:
at least one conductive element spaced from and electrically coupled to one or more of said semiconductor devices; and
interconnections for providing electrical signals to said conductive element, whereby a potential results on said conductive element which alters the threshold voltage characteristics of said coupled semiconductor devices.

31. The device of claim 30, wherein said conductive element comprises a metallization layer, said metallization layer and said coupled semiconductor devices having a dielectric layer interposed therebetween.

32. The device of claim 29, wherein said biasing means comprises:
at least one light-emitting device coupled to one or more of said semiconductor devices; and
interconnections for providing electrical signals to said light-emitting device to produce emissions of photo energy therefrom, whereby said photo energy alters the threshold voltage characteristics of said coupled semiconductor devices.

33. A non-crystalline silicon active device for processing electrical signals, said device comprising:
an integrated circuit having a flexible substrate of large dimension with a non-crystalline silicon layer formed on one side of said substrate, said integrated circuit comprising
a plurality of variably weighted multi-input thin-film summing transistors which have threshold voltage characteristics,
a plurality of variably weighted multi-input thin-film multiplying transistors which have threshold voltage characteristics, at least one of said multiplying transistors having a series array of gate electrodes, and
means electrically interconnecting outputs of preselected ones of said summing and multiplying transistors to the variably weighted inputs of preselected ones of said summing and multiplying transistors, thus providing a highly-connected morphology including neural network architectures; and
biasing means for selectively altering the threshold voltage characteristics of groups of said summing and multiplying transistors.

34. The device of claim 33, wherein at least one summing transistor with a threshold voltage characteristic has a parallel array of weighted gate electrodes, said gate electrodes having successively binary-scaled widths for providing the corresponding weights thereto.

35. The device of claim 34, wherein said non-crystalline silicon is hydrogenated amorphous silicon.

36. The device of claim 34, wherein said integrated circuit is multi-layered, comprising a plurality of electrically-isolated non-crystalline silicon layers formed on said substrate with each layer having a plurality of transistors formed thereon, said circuit layers being interconnected by a plurality of via connectors.

37. The device of claim 34, wherein said biasing means comprises:
at least one conductive element spaced from and electrically coupled to one or more of said transistors; and
interconnections for providing electrical signals from said circuit to said conductive element, whereby a potential results on said conductive element which alters the threshold voltage characteristics of said coupled transistors.

38. The device of claim 37, wherein said conductive element comprises a metal plate, said metal plate and said coupling transistors having a dielectric layer interposed therebetween.

39. The device of claim 34, wherein said biasing means comprises:
at least one light-emitting device coupled to one or more of said transistor gate electrodes; and
interconnections for providing electrical signals from said circuit to said light-emitting device to produce emissions of photo energy therefrom, whereby said photo energy alters the threshold voltage characteristics of said coupled transistors.

* * * * *

UNITED STATES PATENT AND TRADEMARK OFFICE
CERTIFICATE OF CORRECTION

PATENT NO. : 5,440,150

DATED : August 8 1995

INVENTOR(S) : Stanley G. Burns and Robert J. Weber

It is certified that error appears in the above-identified patent and that said Letters Patent is hereby corrected as shown below:

Claim 35, col. 10, line 31, cancel "claim 34" and insert --claim 33--.

Claim 36, col. 10, line 33, cancel "claim 34" and insert --claim 33--.

Claim 37, col. 10, line 39, cancel "claim 34" and insert --claim 33--.

Claim 39, col. 10, line 53, cancel "claim 34" and insert --claim 33--.

Signed and Sealed this

Twenty-fourth Day of October, 1995

Attest:

BRUCE LEHMAN

Attesting Officer

Commissioner of Patents and Trademarks